United States Patent [19]

Shvartsman

[11] Patent Number: 5,279,689

[45] Date of Patent: Jan. 18, 1994

[54] METHOD FOR REPLICATING HOLOGRAPHIC OPTICAL ELEMENTS

[75] Inventor: Felix P. Shvartsman, Wilmington, Del.

[73] Assignee: E. I. Du Pont de Nemours and Company, Wilmington, Del.

[21] Appl. No.: 839,665

[22] Filed: Feb. 14, 1992

Related U.S. Application Data

[63] Continuation of Ser. No. 466,935, Jan. 18, 1990, abandoned, which is a continuation-in-part of Ser. No. 375,100, Jun. 30, 1989, abandoned.

[51] Int. Cl.$^5$ .............................................. B32B 31/00
[52] U.S. Cl. ................... 156/220; 156/235; 156/238; 156/247; 156/273.7; 156/275.5; 156/289; 264/1.3; 264/1.4; 264/107; 369/286
[58] Field of Search ............... 156/220, 219, 209, 212, 156/273.7, 289, 230, 235, 238, 247, 332, 275.5; 264/106, 107, 2.7, 1.1, 1.3, 1.4; 369/284, 286; 428/64, 908; 350/3.7, 3.21, 3.71, 3.72, 162.2, 162.17; 204/5; 522/103, 170

[56] References Cited

U.S. PATENT DOCUMENTS

| | | | |
|---|---|---|---|
| 1,230,816 | 6/1917 | Aylsworth | 264/107 |
| 3,619,024 | 11/1971 | Frattarola | 264/1.3 |
| 3,668,526 | 4/1972 | Haugh | 96/27 |
| 3,867,153 | 2/1975 | MacLachlan | 156/272.2 X |
| 3,944,420 | 3/1976 | Gale et al. | 156/651 |
| 4,022,643 | 5/1977 | Clark | 156/289 X |
| 4,054,635 | 10/1977 | Schlesinger et al. | 264/219 |

(List continued on next page.)

FOREIGN PATENT DOCUMENTS

| | | |
|---|---|---|
| 0223508 | 5/1987 | European Pat. Off. |
| 58-144877 | 8/1983 | Japan |
| 58-144878 | 8/1983 | Japan |
| 58-144879 | 8/1983 | Japan |

OTHER PUBLICATIONS

C. J. Kramer, "Holographic Laser Scanners For Nonimpact Printing," Laser Focus, pp. 70-82, Jun. 1981.
Booth, B. L., "Photopolymer Material for Holography", Applied Optics, 11, Dec. 1972, pp. 2294-2295.
Colburn, W. S., et al., "Volume Hologram Formation in Photopolymer Materials", Applied Optics, 10, Jul. 1971, pp. 1636-1641.
Hasegawa, S., et al., "High Resolution Line Scanner for Use in Diode Laser Printers", Proceedings of the SPIE on Practical Holography II, 747, pp. 8-16 (1987).
Wopschall, R. H., et al., "Dry Photopolymer Film for Recording Holograms", Applied Optics, 11, Sep. 1972, pp. 2096-2097.
Proceedings of EOC4-'91-International Congress on Optical Science & Engineering, Hague, Netherlands, vol. 1507: Holographic Optics III; Principles and Applications, 1991, in press, Dry Photopolymer Embossing, Felix P. Shvartsman.

Primary Examiner—David A. Simmons
Assistant Examiner—Chester T. Barry

[57] ABSTRACT

A method for making an optical image element having a high aspect ratio relief hologram comprising the sequential steps of (a) applying a dry photohardenable film to a surface of a transparent dimensionally stable substrate;
(b) embossing the exposed surface of the photohardenable film with the holographic image by applying thereto under pressure a stamper containing a reverse relief image of the hologram having an aspect ratio of at least 3:1;
(c) passing actinic radiation through the transparent substrate and the photohardenable film to effect hardening of the photohardenable film while it is in contact with the stamper; and
(d) separating the stamper die from the embossed photohardened film.

17 Claims, 3 Drawing Sheets

U.S. PATENT DOCUMENTS

| | | | |
|---|---|---|---|
| 4,273,857 | 6/1981 | Leberzammer et al. | 430/281 |
| 4,293,635 | 10/1981 | Flint et al. | 430/281 X |
| 4,363,844 | 12/1982 | Lewis et al. | 156/245 X |
| 4,431,487 | 2/1984 | Weaver et al. | 204/5 |
| 4,500,392 | 2/1985 | Slaten | 204/5 |
| 4,659,407 | 4/1987 | Lacotte et al. | 156/220 |
| 4,753,865 | 6/1988 | Fryd et al. | 430/281 |
| 4,758,296 | 7/1988 | McGrew | 264/1.3 X |
| 4,758,307 | 7/1988 | Pettigrew et al. | 156/220 |
| 4,790,893 | 12/1988 | Watkins | 156/232 |
| 4,828,356 | 5/1989 | Hobrock et al. | 350/162.17 |
| 4,840,757 | 6/1989 | Blenkhorn | 156/219 |
| 4,846,552 | 7/1989 | Veldkamp et al. | 350/162.17 X |
| 4,923,262 | 5/1990 | Clay | 350/3.71 |
| 4,933,120 | 6/1990 | D'Amato et al. | 264/1.4 X |
| 4,942,102 | 7/1990 | Keys et al. | 430/1 |
| 4,942,112 | 7/1990 | Monroe et al. | 430/909 X |
| 4,965,118 | 10/1990 | Kodera et al. | 264/106 X |
| 5,009,484 | 4/1991 | Gerritsen | 350/162.2 X |

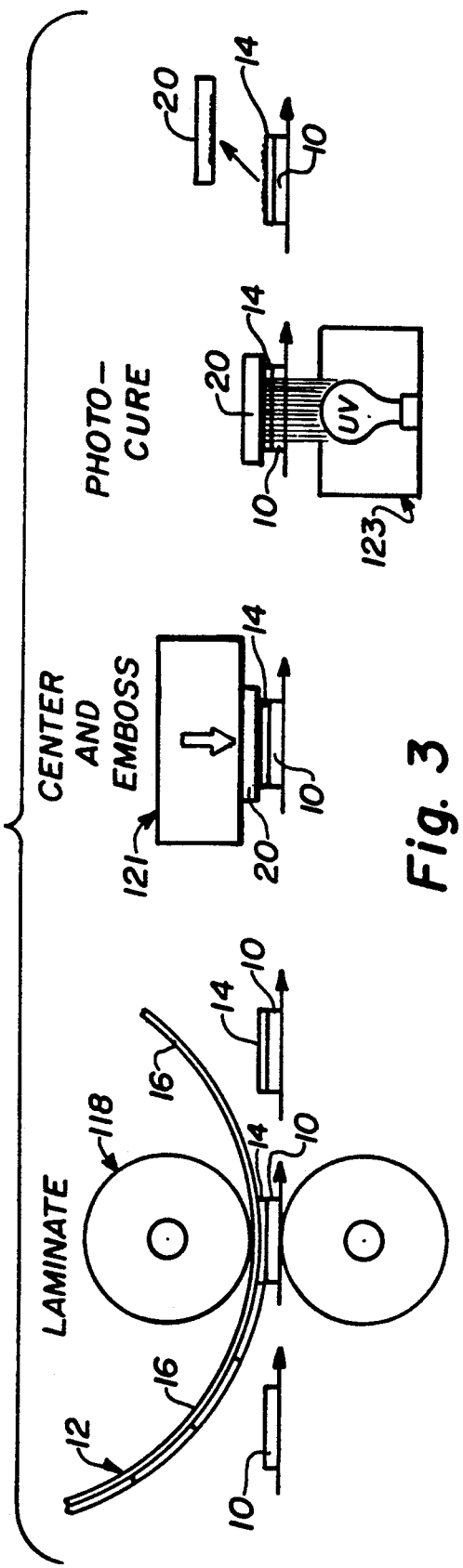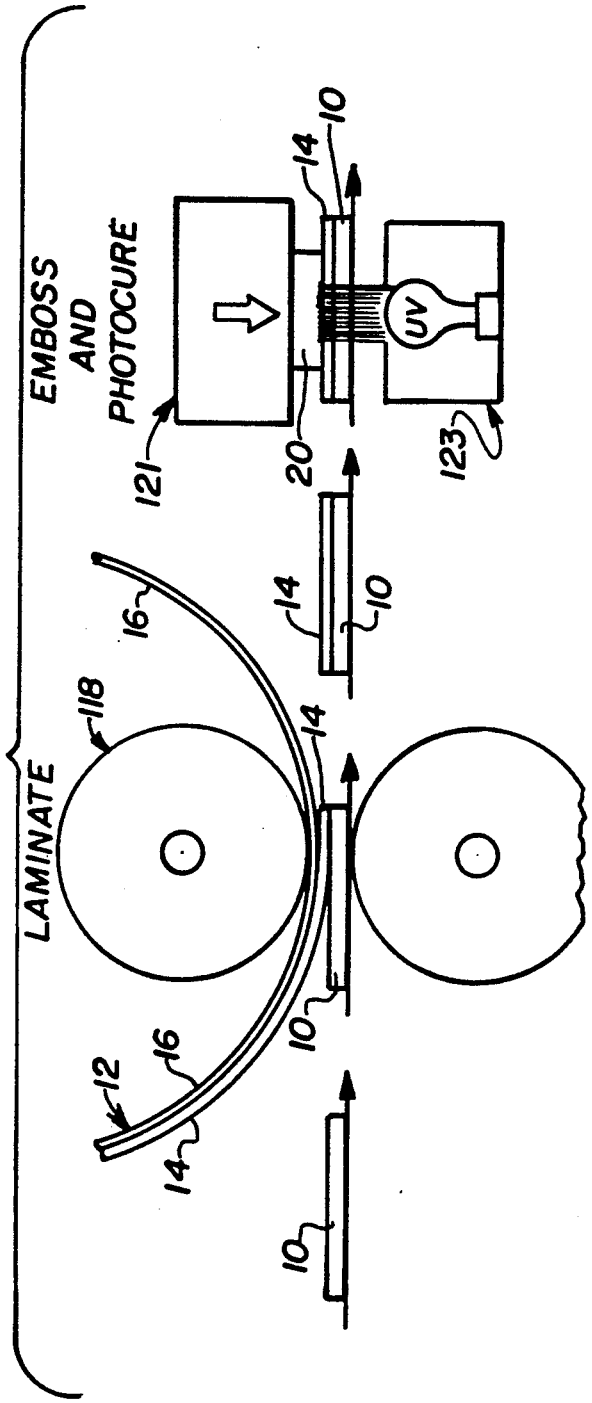

METHOD FOR REPLICATING HOLOGRAPHIC OPTICAL ELEMENTS

This is a continuation of U.S. patent application Ser. No. 07/466,935 filed Jan. 18, 1990 (now abandoned) which was a continuation-in-part application of U.S. patent application Ser. No. 07/375,100 filed Jun. 30, 1989 (now abandoned).

FIELD OF THE INVENTION

The invention is directed to a method for making embossed optical elements and particularly for making embossed holograms.

BACKGROUND OF THE INVENTION

Holographic optical elements are a specialized class of surface relief holograms which are used to replace conventional optical components in laser scanning devices such as rotating mirrors, galvanometers, and other such beam-deflecting devices and their associated optics. Various types of holographic optical elements are described in "Holographic Laser Scanners For Nonimpact Printing" by C. J. Kramer; Laser Focus, pp 70-82, June 1981. European Patent Application 86308641.9, published as 0 223 508 on May 27, 1987, discloses a scanner system using rotating, high efficiency holograms to deflect a light beam achieving a linear scan. The hologram thus allows high system efficiency without requiring the input polarization to be aligned to the fringe pattern. The high efficiency, deep groove, phase hologram required for such a system is obtained by using a photoresist as the recording medium. While photoresist recording media are satisfactory for making individual deep groove, phase holograms, a method is needed to replicate faithfully the holographic optical elements to maintain the high aspect ratio needed for each duplicate element. The term "high aspect ratio" means that the depth of a groove is substantially greater, i.e., 2, 3 or more times greater, than the width of the groove.

Conventional relief holograms used in graphic arts applications, e.g., on bank cards, packaging, and book covers such as the December, 1988 (Vol. 174, No. 6) issue of National Geographic, etc., typically are lower aspect ratio reliefs having a reflective backing. Such holograms may be manufactured by a number of replicating processes including thermal embossing of thermoplastic films having a reflective surface and molding of UV-curable liquid resin layers.

Schlesinger et al. in U.S. Pat. No. 4,054,635 discloses an embossing process for replicating holograms wherein, instead of a nickel master, the hologram or photoresist image is employed directly to replicate impressed images on various thermoplastic materials by heating the hologram or photoresist image and pressing it into the surface of the thermoplastic material to produce replicated impressions of the hologram or photoresist image therein.

Japanese Patent Publication 58144879 discloses the production of hologram copies by irradiation of a curable liquid resin layer sandwiched between a relief hologram and a support. The relief hologram master is prepared conventionally and the liquid resin may consist of monomers, oligomers or prepolymers. In the process, the sandwiched liquid layer is cured by light, e.g., UV light, passing through the transparent support.

Japanese Patent Publication 58144878 discloses the production of hologram copies by coating a relief mold with UV- or electron beam-curable liquid resin, curing the resin and removing the relief mold. Holograms produced include Fresnel, Fourier transformation and Fraunhofer types.

Japanese Patent Publication 58144877 discloses the production of hologram copies by coating a thermoplastic resin mold with a UV-curable liquid resin, curing the resin and then removing the mold.

Although the conventional methods of replicating holograms meet many of the needs of the graphic arts industry, they have been unsatisfactory for replicating the high efficiency, deep groove, phase holograms required for laser scanner systems. In the case of thermal embossing, the deep groove, high aspect ratio relief hologram is not faithfully reproduced and in the case of molded UV-curable liquid resins, a residue of UV-cured resin remains entrapped in the deep grooves of the mold.

SUMMARY OF THE INVENTION

The invention is directed to
1. A method for making an optical image element having a high aspect ratio relief hologram comprising the sequential steps of
   (a) applying a dry photohardenable film to a surface of a dimensionally stable optically transparent substrate;
   (b) embossing the exposed surface of the photohardenable film with the relief holographic image by applying thereto under pressure a stamper containing a reverse relief image of the hologram having an aspect ratio of at least 3:1;
   (c) passing actinic radiation through the transparent substrate and the photohardenable film to effect hardening of the photohardenable film while it is in contact with the stamper; and
   (d) separating the stamper from the embossed photohardened film.

BRIEF DESCRIPTION OF THE DRAWINGS

The Drawing consists of three figures.

FIG. 1 depicts schematically the steps of this invention used for preparing a holographic optical element.

FIG. 3 depicts schematically an in-line manufacturing embodiment of the invention using blank sheet substrates wherein discs are cut from the sheet after the lamination step.

Figure 2A:
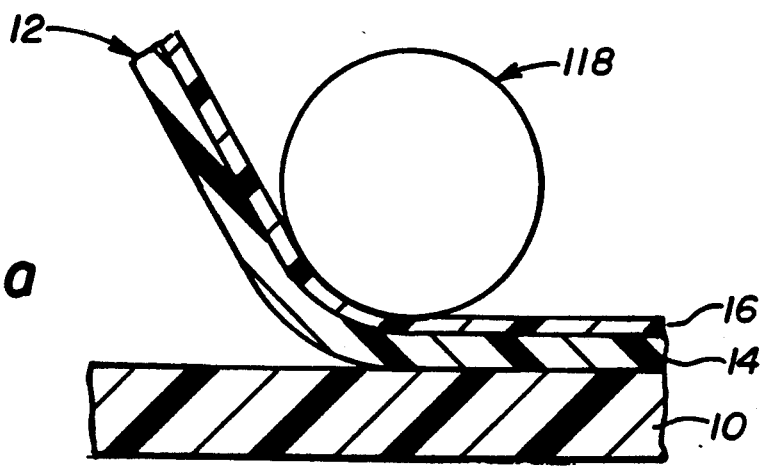
FIGS. 2A-2F is a more detailed schematic description of the holographic element and the process steps used in this invention.

DETAILED DESCRIPTION OF THE INVENTION.

A. Substrate

The substrate functions primarily as a dimensionally stable support for the photohardened information-carrying layer. It may be either rigid or flexible. To function as a suitable substrate, the disc or sheet should (1) be substantially transparent to radiation of the scanner system or end use contemplated, (2) be uniformly thick across the entire surface area, (3) have minimum birefringence, (4) have a refractive index matched to the photohardened layer, and (5) have a disc geometry suitable for the end use contemplated.

The blank substrate can be formulated from a variety of polymeric materials provided that suitable optical criteria are met. Typical of such polymeric materials are poly (methyl methacrylates), polycarbonates and the like. Of these, polycarbonates are preferred due to their better dimensional stability during environmental changes. In some instances, glass, quartz or other transparent inorganic materials may be used as the substrate. Typically, polymeric materials are preferred due to their low cost and the ease of manufacturing discs therefrom.

Blank disc substrates may be formed by conventional molding methods, such as injection molding or injection/compression molding methods, or they may be cut or stamped from preformed sheets of the substrate material. In one embodiment of this invention the geometry of the substrate is formed before lamination of the photohardenable layer. In an alternative embodiment, the geometry of the substrate is cut or stamped from sheets of substrate material after the photohardenable layer has been laminated thereto. In the alternative embodiment, it is possible to carry out all the manufacturing steps before cutting or stamping the disc from the processed sheet laminate.

B. Dry Photohardenable Film

As used herein, the term "dry photohardenable film" or "dry photohardenable layer" refers to a substantially solvent-free polymeric layer having a creep viscosity of about 20 megapoises or greater and preferably between about 100 and 200 megapoises, as measured with a parallel plate rheometer. Such "dry photohardenable layers" are contrasted with conventional liquid photohardenable layers which typically have viscosities of about several hundred poises or less. For the purpose of this invention, viscosity is measured as creep viscosity with a parallel plate rheometer using a Du Pont Model 1090 Thermal Mechanical Analyzer. In this procedure, a 0.036 inch thick sample is placed in contact between two flat discs (about 0.25 inch diameter). A quartz probe which is capable of accepting additional weights is positioned atop the upper disc and the same/disc assembly is maintained at constant temperature of 40° C. and RH of 44% throughout the measurement. Creep viscosity is calculated from the rate of decrease of sample thickness under equilibrated conditions. The 0.036 inch sample is prepared by laminating together sufficient layers of the test film to obtain the desired thickness. The laminate is then cut to provide a circular sample slightly larger in diameter than that of the rheometer plates.

The photohardenable layer is laminated to the substrate as a preformed dry film photohardenable element comprised of a temporary support sheet or web and a uniformly thick dry photohardenable layer releasably adhered thereto. The photohardenable element may be cut sheets or it may be in the form of a rolled web for ease of use and storage. The non-laminated second side of the photohardenable layer may have a removable protective cover film which is removed before use by stripping it off.

Uniformly thick, dry, photohardenable layers useful in this invention typically have a thickness which compliments the thickness of the substrate so that the thickness criteria of the finished product is met.

The photohardened layer should be firmly adhered to the substrate surface and should have optical characteristics comparable to those of the surface. Preferably the refractive index of the photohardened layer should match that of the substrate $10 \pm 0.1$ measured at the end use radiation.

The photohardenable layer is a thermoplastic composition which upon exposure to actinic radiation, polymers of higher molecular weight by crosslinking and/or by polymerization. This changes the rheological character of the composition and decreases its solubility in common solvents. Preferred photohardenable compositions are photopolymerizable compositions wherein free radical addition of polymerization and crosslinking of a compound containing one or more ethylenically unsaturated groups, hardens and insolubilizes the composition. The photosensitivity of the photopolymerizable composition is enhanced by a photoinitiating system which may contain a component which sensitizes the composition to practical radiation sources, e.g., visible light. Conventionally a binder is the most significant component of a substantially dry photopolymerizable film or layer in terms of what physical properties the film or laminate will have while being used in the process of the invention. The binder serves as a containing medium for the monomer and photoinitiator prior to exposure, and after exposure contributes to the optical and other physical characteristics needed for the optical element. Cohesion, adhesion, flexibility, miscability, tensile strength, and index of refraction (IR) are some of the many properties which determine if a binder is suitable for use in an optical element. In practicing the invention dry film photopolymerizable elements of various types may be used such as those disclosed in U.S. Pat. No. 3,469,982; U.S. Pat. No. 4,273,857; U.S; 4,278,752; U.S. Pat. No. 4,293,635; U.S. Pat. No. 4,621,043; U.S. Pat. No. 4,693,959; U.S. Pat. No. 3,649,268; U.S. Pat. No. 4,191,572; U.S. Pat. No. 4,247,619; U.S. Pat. No. 4,326,010; U.S. Pat. No. 4,356,253 and European Patent Application 87106145.3 filed Apr. 28, 1997. All of these are incorporated herein by reference.

Other equivalent dry film photohardenable film elements include photodimerizable or photocrosslinkable compositions such as disclosed in U.S. Pat. No. 3,526,504 or those compositions in which hardening is achieved by a mechanism other than the free radical-initiation identified above.

In general the photopolymerizable compositions useful in carrying out this invention contain an ethylenically unsaturated monomer, a free radical-generating initiating system and a binder.

Suitable monomers which can be used as the sole monomer or in combination with others include the following: t-butyl acrylate, 1,5-pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexenediol diacrylate, 2,2-dimethylolpropane diacrylate, glycerol diacrylate, tripropylene glycol diacrylate, glycerol triacrylate, trimethylolpropane triacrylate, pentaerythritol triacrylate, polyoxyethylated trimethylolpropane triacrylate and trimethacrylate and similar compounds as disclosed in U.S. Pat. No. 3,380,831, 2,2-di(p-hydroxyphenyl)-propane diacrylate, pentaerythritol tetraacrylate, 2,2-di-(p-hydroxyphenyl)-propane dimethacrylate, triethylene glycol diacrylate, polyoxyethyl-2,2-di-(p-hydroxyphenyl)-propane dimethacrylate, di-(3-methaeryloxy-2-hydroxypropyl) ether of bisphenol-A, di-(2-methaeryloxyethyl) ether of bisphenol-A, di(3-acryloxy-2-hydroxypropyl) ether of bisphenol-A, di(2-acryloxyethyl) ether of bisphenol-A, di(3-methacryloxy-2-hydroxypropyl) ether of tetrachloro-bisphenol-A, di(2-methacryloxyethyl) ester of tetrachloro-bisphenol-A, di-(3-methacryloxy-2-hydroxypropyl) ether of tetrabromo-bisphenol-A, di-(2-methacryloxyethyl) ether of tetrabromo-bisphenol-A, di-(3-methacryloxy-2-hydroxypropyl) ether of 1,4-butanediol, di-(3-methacryloxy-2-hydroxypropyl) ether of diphenolic acid, triethylene glycol dimethacrylate, polyoxypropyltrimethylol propane triacrylate (462), ethylene glycol dimethacrylate, butylene glycol dimethacrylate, 1,3-propanediol dimethacrylate, 1,2,4-butanetriol trimethaerylate, 2,2,4-trimethyl-1,3-pentanediol dimethacrylate, pentaerythritol trimethacrylate, 1-phenyl ethylene-2-dimethacrylate, pentaerythritol tetramethacrylate, trimethylol propane trimethacrylate, 1,5-pentanediol dimethacrylate, diallyl fumarate, styrene, 1,4-benzenediol dimethacrylate, 1,4-diisopropenyl benzene, and 1,35-triisopropenyl benzene.

In addition to the ethylenically unsaturated monomers mentioned above, the photohardenable layer can also contain one or more free radical-initiated, chain-propagating, addition-polymerizable, ethylenically unsaturated compounds generally having a molecular weight of at least about 300. Preferred monomers of this type are an alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, e.g., those having a plurality of addition polymerizable ethylenic linkages particularly when present as terminal linkages. Especially preferred are those wherein at least one preferably most of such linkages are conjugated with a double bonded carbon, including carbon double bonded to carbon and to such heteroatoms as nitrogen, oxygen and sulfur. Outstanding are such materials wherein the ethylenically unsaturated groups, especially the vinylidene groups, are conjugated with ester or amide structures.

Preferred free radical-generating addition polymerization initiators activatable by actinic light and thermally inactive at and below 185° C. include the substituted or unsubstituted polynuclear quinones which are compounds having two intracyclic carbon atoms in a conjugated carbocyclic ring system, e.g., 9,10-anthraquinone, 1-chloroanthraquinone, 2-chloroanthraquinone, 2-methylanthraquinone, 2-ethylanthraaquinone, 2-tert-butylanthraquinone, octamethylanthraquinone, 1,4-naphthoquinone, 9,10-phenanthrenequinone, 1,2-benzaanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone alpha-sulfonic acid, 3-chloro-2-methylanthraquinone, retenequinone, 7,8,9,10-tetrahydronaphthacenequinone, and 1,2,3,4-tetrahydrobenz(a)anthracene-7,12-dione. Other photoinitiators which are also useful, even though some may be thermally active at temperatures as low as 85° C., are described in U.S. Pat. No. 2,760,863 and include vicinal ketaldonyl alcohols, such as benzoin, pivaloin, acyloin ethers, e.g., benzoin methyl and ethyl ethers; α-hydrocarbon-substituted aromatic acyloins, including α-methylbenzoin, α-allylbenzoin and α-phenylbenzoin. Photoreducible dyes and reducing agents disclosed in U.S. Pat. Nos. 2,850,445; 2,875,047; 3,097,096; 3,074,974; 3,097,097; and 3,145,104 as well as dyes of the phenazine, oxazine, and quinone classes; Michler's ketone, benzophenone, 2,4,5-triphenylimidazolyl dimers with hydrogen donors, and mixtures thereof as described in U.S. Pat. Nos. 3,427,161; 3,479,185; and 3,549,367 can be used as initiators. Similarly the cyclohexadienone compounds of U.S. Pat. No. 4,341,860 are useful as initiators. Also useful with photoinitiators are sensitizers disclosed in U.S. Pat. No. 3,652,275, U.S. Pat. No. 4,162,162, U.S. Pat. No. 4,454,218, U.S. Pat. No. 4,535,052 and U.S. Pat. No. 4,565,769.

Suitable binders which are polymeric when employed with polymerizable monomers can be used alone, or in combination with one another include the following: polyacrylate and alphaalkyl polyacrylate esters, e.g., polymethyl methacrylate and polyethyl methacrylate; polyvinyl esters, e.g.,polyvinyl acetate, polyvinyl acetate/acrylate, polyvinyl acetate/methacrylate and hydrolyzed polyvinyl acetate; ethylene/vinyl acetate copolymers; polystyrene polymers and copolymers, e.g., with maleic anhydride and esters; vinylidene chloride copolymers, e.g., vinylidene chloride/acrylonitrile; vinylidene chloride/methacrylate and vinylidene chloride/vinyl acetate copolymers; polyvinyl chloride and copolymers, e.g., polyvinyl chloride/acetate; saturated and unsaturated polyurethanes; synthetic rubbers, e.g., butadiene/acrylonitrile, acrylonitrile/butadiene/styrene, methacrylate/acrylonitrile/butadiene/styrene copolymers, 2-chlorobutadiene-1,3 polymers, chlorinated rubber, and styrene/butadiene/styrene, styrene/isoprene/styrene block copolymers; high molecular weight polyethylene oxides of polyglycols having average molecular weights from about 4,000 to 1,000,000: epoxides, e.g., epoxides containing acrylate or methacrylate groups: copolyesters, e.g., those prepared from the reaction product of a polymethylene glycol of the formula $HO(CH_2)_nOH$, where n is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids; nylons or polyamides, e.g., N-methoxymethyl polyhexamethylene adipamide; cellulose esters, e.g., cellulose acetate, cellulose acetate succinate and cellulose acetate butyrate; cellulose ethers, e.g., methyl cellulose, ethyl cellulose and benzyl cellulose; polycarbonates; polyvinyl acetal, e.g., polyvinyl butyral, polyvinyl formal: polyformaldehydes. Acid containing polymers and copolymers functioning as suitable binder include those disclosed in U.S. Pat. No. 3,458,311 and in U.S. Pat. No. 4,273,857. Amphoteric polymeric binders are disclosed in U.S. Pat. No. 4,293,635.

In place of or in addition to the polymeric binders listed above particulate thickeners with discrete, orderly orientation can be used such as are disclosed in U.S. Pat. No. 3,754,920, e.g., silicas, clays, alumina, bentonites, kaolonites, etc.

Other components in addition to those described above can be present in the photopolymerizable compositions in varying amounts. Such components include: plasticizers, antioxidants, optical brighteners, ultraviolet radiation absorbing material, thermal stabilizers, hydrogen donors and release agents.

Optical brighteners useful in the process of the invention include those disclosed in U.S. Pat. No. 3,854,950, incorporated herein by reference. A preferred optical brightener is 7-(4'-chloro-6'-di-ethylamino-1',3',5'-triazine-4'-yl) amino 3-phenyl coumarin. Ultraviolet radiation absorbin materials useful in the invention are also disclosed in U.S. Pat. No. 3,854,950.

Useful thermal stabilizers include: hydroquinone, phenidone, hydroquinone monomethyl ether, p-methoxyphenol, alkyl and aryl-substituted hydroquinones and quinones, tert-butyl catechol, pyrogallol, copper resinate, naphthylamines, betanaphthol, cuprous chloride, 2,6-di-tert-butyl p-cresol, phenothiazine, pyridine, nitrobenzene, dinitrobenzene, p-toluquinone and chloranil. the dinitroso dimers described in U.S. Pat. No. 4,168,982, incorporated herein by reference, are also useful. Normally a thermal polymerization inhibitor will be present to increase stability in the storage of the photopolymerizable composition.

Hydrogen donor compounds useful in the photopolymer compositions include: 2-mercaptobenzoxazole, 2-mercaptobenzothiazole, etc.: as well as various types of compounds, e.g., (a) ethers, (b) esters, (c) alcohols, (d)compounds containing allylic or benzylic hydrogen cumene, (e) acetals, (f) aldehydes, and (g) amides as disclosed in column 12, lines 18 to 58 of U.S. Pat. No. 3,390,996, incorporated herein by reference.

Compounds which have been found useful as release agents are described in U.S. Pat. No. 4,326,010, incorporated herein by reference. A preferred release agent is polycaprolactone.

Amounts of ingredients in the photopolymerizable compositions will generally be within the following percentage ranges based on total weight of the photopolymerizable layer: monomer, 5-50%, preferably 15-25%, initiator 0.1-10%, preferably 1-5% binder, 25-75%, preferably 35-50%, plasticizer, 0-25%, preferably 5-15%, other ingredients 0-5%, preferably 1-4%.

The temporary support film of the photohardenable film element can be any of a number of films such as those described in U.S. Pat. No. 4,174,216. The primary criteria for the film is that it possess I 0 dimensional stability and the surface smoothness and release characteristics needed to laminate a uniform layer of photohardenable composition to the substrate surface without distortion of the layer when the support film is removed as in FIG. 2b. To meet this criteria the cohesive force of the photohardenable layer and its adhesive force to the substrate must be greater than its adhesive force to the temporary support film. A preferred support is polyethylene terephthalate.

A second temporary cover sheet, or interleaf may be placed on the second surface of the photopolymerizable layer to protect it from contaminants during storage in roll or stacked cut sheet form and to prevent blocking of the stored element. If used, the protective cover sheet or interleaf is removed from the surface of the photopolymerizable layer before the layer is laminated to the substrate. Any number of films can be used as the cover film provided the film has a suitable surface smoothness and has less adhesion to the photopolymerizable layer than the layer has to the support film. Suitable protective cover sheets or interleafs include polyethylene, polypropylene, etc.

C. Protective Layer

Typically a protective layer is applied over the embossed surface to seal it and provide an abrasion resistant outer surface. The protective layer may be any preformed film or sheet possessing optical characteristics matched to the substrate and the photohardened, embossed layer. Typically, such preformed protective layers are suspended out of contact with the embossed, photopolymerized layer by spacers at their edges which likewise seal the layers together. The air-gap formed thereby, provides maximum refractive index difference at the embossed-surface/air interface. Preferably the preformed protective layer in this instance is the same as the substrate, having the same composition and physical dimensions, resulting in a balanced air-sandwich element. Typical materials for forming preformed, protective layers are those used for the substrate with poly (methyl methacrylate) being preferred. The spacer may be an integral lip at the edge(s) of the substrate and/or protective layer or it may be a separate component. A preferred spacer is a dimensionally uniform adhesive component applied between the edges of the substrate and the protective layer.

Alternatively the protective layer may be applied as a liquid to the embossed, photopolymer layer and hardened, provided that the liquid itself does not adversely affect the embossed, photopolymer surface and that the hardened protective layer has a refractive index sufficiently different from that of the photopolymer layer to provide the needed light diffraction. Such liquid layers may be conventionally coated as a solution and then dried to a hardened layer or they may be coated as a neat solvent-free liquid which is hardened photolytically, thermally or chemically.

The transparent, protective layer may also be vapor-deposited on the embossed, photopolymerized surface using conventional vacuum deposition, sputtering or other such procedure. Likewise the protective layer may be applied as a composite of such vapor-deposited and liquid-coated layers.

D. Embossing

After removing the temporary support, the surface of the photohardenable layer is embossed with an information relief by pressing at room temperature an embossing die or stamper bearing on its surface the negative of the information relief in the form of grooves/peaks. While simple hand pressure is sufficient to embed the stamper surface into the photohardenable layer, use of a press is preferred where uniform high pressure across the surface can be applied momentarily to insure complete conformity of the layer surface to the stamper surface. Similarly, the stamper can be uniformly embedded into the photohardenable layer by passing the aligned laminate/stamper through the nip of a pressure roll laminator, followed by the use of a press. After the stamper's negative relief image has been uniformly embedded in the photohardenable layer, pressure may be relaxed or removed and the photohardenable layer then exposed to actinic radiation passing through the transparent substrate. Alternatively, high pressure may be maintained during actinic exposure.

The embossing die or stamper may be any conventional stamper such as those used in the manufacture of compact discs or video discs. Such stampers are prepared by methods well known in the art, such as in U.S. Pat. No. 4,474,650 which is incorporated herein by reference. In addition, the stamper itself may be a photopolymerized element prepared, for example, by the process of this invention, as follows:

The method of making such photohardened stampers is comprised of the following sequence of steps:

(a) applying an optically transparent dry photohardenable film to a surface of a dimensionally stable substrate;

(b) embossing the exposed surface of the photohardenable film with the surface of relief information;
(c) passing actinic radiation through the dry photohardenable film to effect hardening of the film while it is in contact with the relief information;
(d) separating the photohardened film from the relief information: and
(e) using the embossed photohardened film as a stamper.

The substrate may be either rigid or flexible so long as it is dimensionally stable in the x-y plane and preferably transparent to actinic radiation.

When the stamper is made from a photopolymerized element, it is preferred that a release coating be placed on the embossing surface to facilitate release of the stamper from the embossed medium. Various materials can be used for this purpose, among which are metals such as aluminum and chromium and organic polymers having a low surface energy such as fluoropolymers. The metals can be coated by sputtering and the polymers can be coated by either sputtering or by plasma polymerization.

While the stamper typically is a flat embossing die, it may also be an embossing roll, wherein the roll has one or more negative information tracks along the length of its surface. Such embossing rolls are particularly useful when simultaneously embossing and exposing laminated sheet substrate as in FIG. 3. In this instance, the photohardenable layer is exposed to actinic radiation dust after the nip of the roll imbeds a segment of the negative information relief into the layer with sufficient intensity to fix the dimensions of the information relief in the photohardenable layer before the roll surface detaches from the embossed element. Further treatment may then be applied to completely cure or harden the embossed photohardened layer.

In the instance when preformed substrates are used, e.g., having a disc structure, the sheet support is removed and the stamper is centered over the laminate structure, e.g., using a cylinder in the annular hole of a disc. Shim structure may be provided around the laminate structure to insure surface thickness limitations are met. The centered stamper is then pressed into the photohardenable surface by a mechanical or hydraulic press for the required duration. The photohardenable layer may be exposed to actinic radiation as in FIG. 2D while pressure is applied or the laminate/stamper composite may be removed and placed in a conventional radiation source. After photohardening is complete to the extent that the information relief is fixed in place, the stamper may be removed from the composite to give a laminate photohardened structure having an embossed surface containing the relief as in FIG. 2E. If further curing is required to completely harden the layer any convenient means may be used, e.g., further actinic exposure, heat treatment, electron beam, etc.

E. Photohardenable Layer Application

The photohardenable layer may be applied to the substrate as a preformed solid dry film or as a liquid solution. When the layer is applied as a liquid solution, conventional coating methods may be used such as spin coating, curtain coating, extrusion and the like. It is, however, preferred to apply the photohardenable layer as a preformed solid dry film by lamination.

The photohardenable layer can be laminated to the surface of the substrate using any conventional laminating system. Suitable systems for applying a dry film to a substrate include hot roll laminators or laminators with a heated platen or shoe as disclosed in U.S. Pat. No. 3,469,982; U.S. Pat. No. 3,547,730; U.S. Pat. No. 3,649,268 and U.S. Pat. No. 4,127,436 each of which is incorporated herein by reference. Useful laminating systems wherein a liquid is used to enhance adhesion include those disclosed in U.S. Pat. No. 3,629,036; U.S. Pat. No. 4,069,076; U.S. Pat. No. 4,405,394 and U.S. Pat. No. 4,378,264 each of which is incorporated herein by reference. Particularly useful are commercial hot roll laminators, e.g., Du Pont Cromalin® Laminator and Du Pont Riston® Hot Roll Laminator and Laminator, Model 100.

In the laminating step of this invention the protective cover sheet or interleaf, if present, is first removed from the photohardenable layer and the layer is applied to the surface of the substrate under pressure and typically with heat so that interfacial air is removed and void free adhesion between the substrate and the layer is effected. Preferably a hot roll laminator is used to effect such void free adhesion.

In those instances where a preformed substrate is used, e.g., a blank disc, a carrier sheet may be used to carry each preformed substrate or an array of substrates into and through the nip of the laminator to prevent contamination of the rear surface of each substrate. Ordinary paper sheets or webs are suitable as a carrier sheet provided they are lint free and likewise free of contaminants. A suitable carrier sheet is Cromalin® Masterproof Commercial Receptor, Du Pont product CM/CR or other like material. Also in those instances where preformed substrates are used excess areas of the photohardenable element are cut from the edges of the laminated substrate, e.g., from the edges and hole of a laminated preformed disc. In those instances where the adhesive/cohesive forces are carefully balanced, trimming of excess photohardenable material from the laminate may be effected by peeling the support sheet therefrom with excess material adhering thereto.

F. Element Configuration

As illustrated previously the shape of the element may be formed before the process of this invention by conventional molding, stamping or cutting processes or the shape may be formed by cutting or stamping the element from the sheet array. However the element can be removed from the sheet array in the same manner, once the relief has been embossed in the element area of the sheet. In this instance, each embossed element would be further processed as an individual piece. Similarly, the shape of the element may be formed between any of the intervening steps of the process.

Although the shape of the element may be formed with its final lateral dimensions as indicated above, one or more trimming steps may be introduced to form final dimensions from an outsized blank.

The advantageous properties of the lamination and embossing process of this invention can be observed by reference to the drawings and to the examples which follow.

Figure 2B:
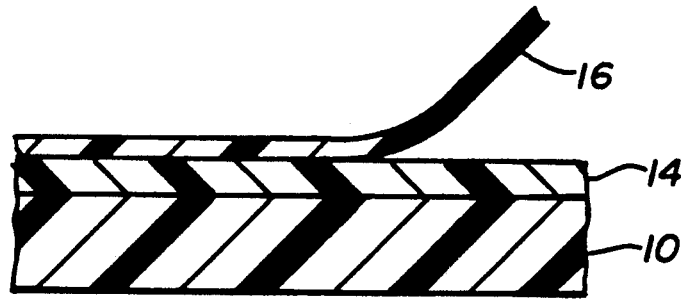
Figure 2C:
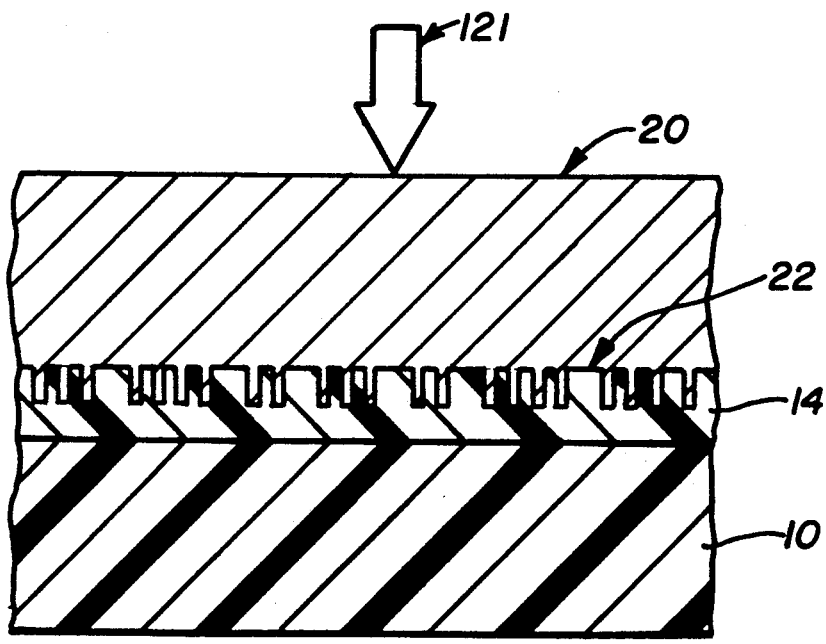

Referring to FIGS. 1 and 2 of the Drawing, a preformed blank disc substrate 10 on a carrier sheet is introduced into the nip of a roll laminator 118 along with a sheet or web of a dry photohardenable film element 12 whereby the photohardenable layer 14 is laminated to the flat surface of the blank disc using heat and/or pressure as in FIG. 2a. After trimming extraneous photohardenable film 12 from the edges of the disc 10, the temporary support film 16 of the photohardenable element 12 is removed as in FIG. 2b. An embossing die or stamper 20 is positioned in registry with the trimmed laminated element and then pressed into the surface of the photohardenable layer 14 as in FIG. 2c using pressure means 121 to form an embossed surface 22.

Figure 2D:
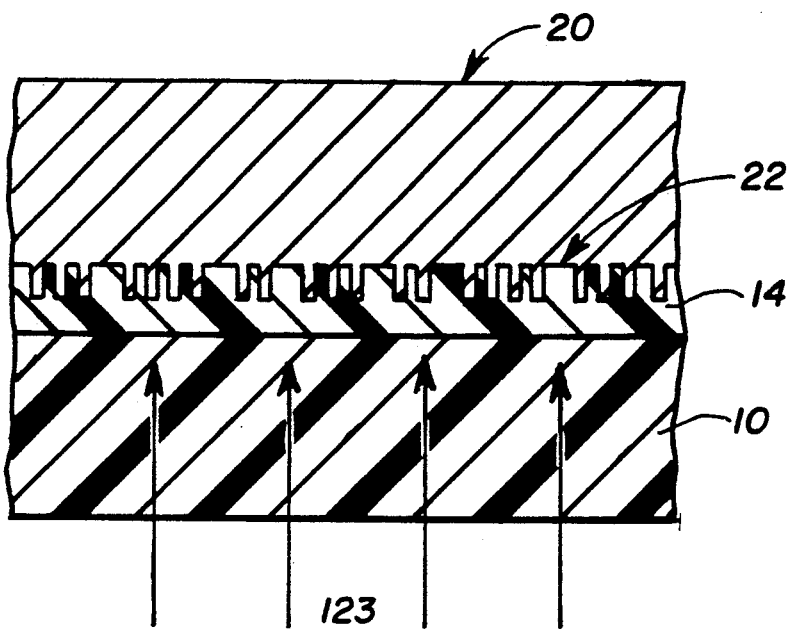

Before the stamper 20 is removed from the embossed surface 22, the photohardenable layer 14 is photohardened as in FIG. 2d by exposure to actinic radiation passing through the disc substrate 10 from a radiation source 123. Any source of actinic radiation can be used to expose and cure the layer provided the source is matched to the photohardenable system being used. Photopolymerizable and photocrosslinkable systems typically are sensitive to radiation in the near ultraviolet light range and into the visible portion of the spectrum. The primary requirement of the actinic radiation/photohardenable system is that the radiation used be capable of initiating hardening in the system and that residual initiators in the photohardened layer do not adversely interfere with optical characteristics of the element. Encompassed in the process of this invention are ultraviolet and visible radiation, particularly in the near ultraviolet region. The source of actinic radiation may be any of a number of commercially available systems, e.g., Douthitt VIOLUX metal halide light system, Olec OLITE halide printing light, and the like, or may be a dedicated system manufactured from conventional components.

Figure 2E:
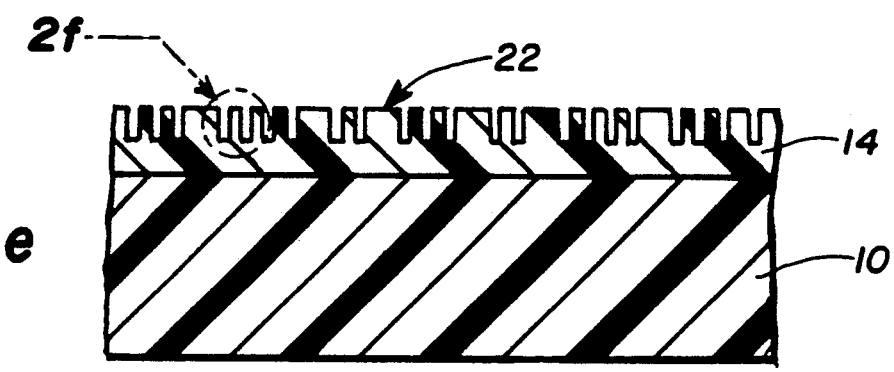

After photohardening or curing is complete, the stamper 20 is removed from the embossed surface 22 to produce an embossed disc as in FIG. 2e having a high aspect ratio relief hologram.

Figure 2F:
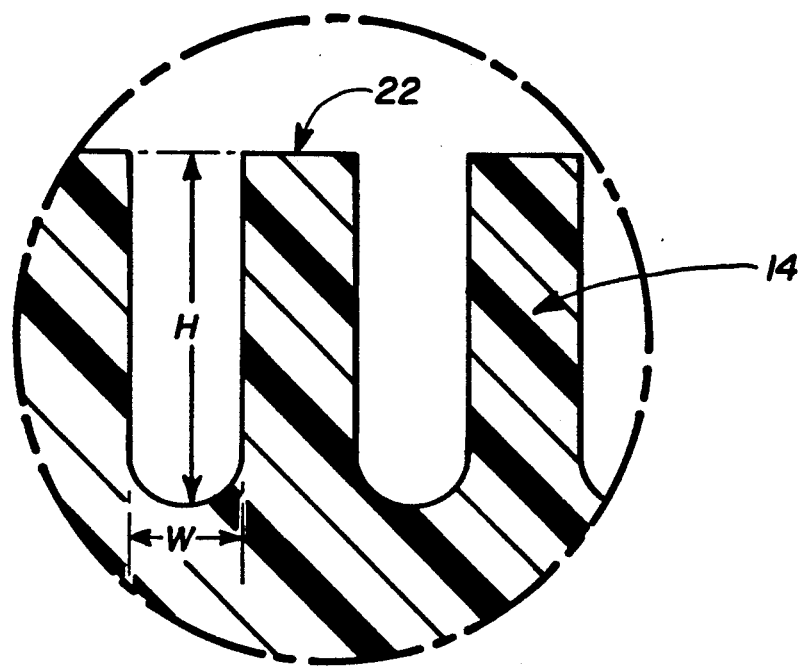

The high aspect ratio of the holograms made by the method of the invention can be seen in FIG. 2f, which is an enlarged view of Area A of the element cross section shown in FIG. 2e.

Referring to FIG. 2f, the aspect ratio of the relief image is the ratio of the height of the groove/peak, H, to its width, W. In this context, a high aspect ratio is considered to be at least 3:1. In a preferred aspect of the invention, an aspect ratio of 10:1 or higher can be achieved with faithful reproduction of the holographic relief.

Turning now to FIG. 3 of the Drawing, an alternative embodiment of the process of this invention is depicted wherein a single blank sheet is used to prepare several elements. In this embodiment, a blank sheet substrate 10 is introduced into the nip of a roll laminator 118 along with a sheet or web of a dry photohardenable film element 12 wherein the photohardenable layer 14 is laminated and adhered to the top surface of the blank sheet substrate 10. After lamination, the temporary support film 16 of the photohardenable element 12 is removed. An embossing die or stamper 20 is positioned in register over a portion of the laminated sheet with a light source 123 positioned thereunder. The stamper 20 is then pressed into the surface of the photohardenable layer 14 to form an embossed surface followed immediately by exposure to actinic radiation to photoharden or cure the layer 14 before the stamper 20 is removed. After exposure, the stamper 20 is removed and along with the radiation source 123 moves to another portion of the laminated sheet whereupon the embossing and exposure steps are repeated. This step-embossing/exposure procedure may be used repeatedly to form disc information reliefs on the remaining portions of the laminated sheet. Alternatively, an array of stampers 20 may be used in conjunction with a suitable radiation source(s) 123 simultaneously to form disc information reliefs in a number of portions of the photohardenable layer 14 of the sheet laminate. The array may cover the entire useable portion of the sheet substrate or may be a linear array across the width of the sheet which is then stepped along the length of the sheet laminate. Either before application of the protective layer or preferably after, each element is cut or punched from the array in registry with the information relief by means of an appropriate punch or cutter (not depicted). While this invention has been described with respect to the manufacture of disc-shaped elements, it can also be used for other configurations such as cards, webs, tapes, drums or other such shapes.

EXAMPLES

EXAMPLE 1

This example illustrates the preparation of a holographic optical element for use in an optical scanner using preformed substrates as shown in FIG. 1 of the Drawing.

The substrate, which serves as a mechanical support, is a 1.2 mm thick, 120 mm diameter injection/compression-molded poly (methal methacrylate) disc with a 15 mm cylindrical center hole.

The embossable layer is applied to the substrate in the form of a dry film by hot roll lamination. A dry film photopolymer element is prepared by machine coating a methylene chloride solution, the photopolymerizable composition described below onto 12.7 micron (0.0005 inch) polyethylene terephthalate film; a 25.4 micron (0.001 inch) polyethylene film is used as a temporary interleaf. The dried photopolymerizable layer is 25.4 micrometers thick.

The composition of the dry film photopolymer element is as follows:

GLOSSARY

Brij ® 30: Polyoxyethylene (4)lauryl ether Brij ® is a registered trademark of ICI Americas, Inc., Wilmington, Del.

Cyasorb ® UV-24: (2-Hydroxy-4-methoxyphenyl)(2-hydroxyphenyl) methanone; CAS 131-53-3 Cyasorb ® is a registered trademark of American Cyanamid Co., Wayne, N.J.

Tinopal ® PCR 2-(Stibyl-4")-(naphto-1',2'4,5)-1,2,3-triazol-2"-sulfonic acid phenyl ester; Benzenesulfonic acid, 5-(2H-naphtho<1,2-D>-trizole-2-ly)-2-(2-phenylethyl)-, phenyl ester; CAS 6994-51-0; Tinopal ® is a registered trademark of Ciba Geigy Corporation, Howthorne, N.Y.

Tinopal ® SFG 3-Phenyl-7-[2'-(4'-N,N-Diethylamino-6-chloro-1',3',5'-triazinylaminol-coumarin; Ciba-Geigy TMPTMA: Trimethylolpropane trimethacrylate: 2-ethyl-2-(hydroxymethyl)-1,3-propanediol trimethacrylate; CAS 3290-92-4

TEOTA: Triacrylate ester of ethoxylated trimethylolpropane o-Cl-HABI: 1,1'-Biimidazole, 2,2'-bis [o-chlorophenyl]-4,4',5,5'-tetraphenyl-; CAS 1707-68-2

Elvacite ® 2051; Poly(methyl methacrylate); MW=350,000 Evlacite ® is a registered trademark of E. I. duPont de Nemours and Co., Wilmington, Del.

Vinac ® B-15 Poly(vinyl acetate); M.W. 90,000; CAS 9003-20-7; Vinac ® is a registered trademark of Air Products and Chemicals Corp., Allentown, Pa.

TAOBN: 1,4,4-Trimethyl-2,3-diazobicyclo-(3.2.2)-non-2-ene-2,3-dioxide.

| INGREDIENT | AMOUNT (g) |
| --- | --- |
| Elvacite ® 2051 | 32.40 |
| Vinac ® B-15 | 12.64 |
| TMPTMA | 35.55 |
| TEOTA | 7.90 |
| o-Cl-HABI | 1.58 |
| 2-Mercapto benzoxazole | 0.71 |
| Tinopal ® PCR | 0.20 |
| Tinopal ® SFG | 0.99 |
| Cyasorb ® UV-24 | 0.08 |
| Brij ® 30 | 7.90 |
| Hydroquinone | 0.05 |
| TAOBN | 0.03 |

To support the disc during lamination, it is placed on a temporary carrier sheet of commercial color proofing receptor (Cromalin ® Masterproof Commercial Receptor, Product No. CM/CR, E. I. Du Pont de Nemours and Company, Inc., Wilmington, Del.). The dry film is laminated to the substrate using a Cromalin ® laminator (Du Pont, Wilmington, Del.) operating at a roll surface temperature of 115°–124° C. Lamination covers the disc surface uniformly and seals it around the edges to the carrier sheet; the disc is cut out with a razor blade and the laminated film cut away from the center hole.

Holographic relief information is transferred to the laminated disc by embossing the dry film layer with a nickel stamper carrying a surface relief corresponding to the holographic optical clement. Holographic diffraction peaks/grooves on the stamper are approximately 0.1 to 3.5 microns and have an aspect ratio of about 20:1 (Aspect ratio is the ratio of the height of the peak/groove to its width.) The polyester cover sheet is removed from the laminated disc. To center the stamper, a centering pin is first inserted into the disc center hole. The stamper is then concentrically fitted to the disc using the same pin. A sandwich is made by pressing the stamper onto the information layer with pressure rolls. The tackiness of the layer holds the stamper in place and the centering pin is removed. The sandwich is then placed between polycarbonate shims to protect the sandwich from the press platens. The sandwich is loaded at room temperature into a 70,000 lb. capacity hydraulic platen press with 12×12 inch die space, 5 inch diameter ram and manual lever action (Pasadena Hydraulics, Inc., Pasadena, Calif.). The load is quickly increased to 40,000 lb., corresponding to a pressure of 2,282 lb./in.$^2$ based on a 17.5 sq. in. sandwich area. The load is released after 15 seconds dwell time and the shimmed sandwich is removed from the press. The shims are then removed from the sandwich.

The embossed information layer is then firmly bonded to the substrate and the embossing made permanent by ultraviolet radiation exposure. The stamper-substrate sandwich, with the transparent substrate facing the light source, is placed approximately 50.8 cm (20 in.) from the source in a high intensity ultraviolet exposure unit (5 kill OLITE ® Printing Light, Model AL53-M, Olec Corp., Irvine, Calif.). After a 15-s exposure, the stamper is removed by flexing the assembly slightly. The embossed disc is conditioned for 2 minutes in an argon atmosphere and again exposed 15 seconds in the ultraviolet exposure unit. The embossed surface is inspected with a microscope. It is clear that stamper information has been transferred to the photopolymer layer with good fidelity.

The cured embossed disc contains all the required relief information to be used as the optical scanning element and is used successfully in a scanner system as disclosed in European Patent Application 86308641.9.

EXAMPLE 2

This example illustrates the preparation of a holographic optical element with an air-gap protective cover.

A disc holographic optical element for use in a scanner system is prepared as described in Example 1. To the cured embossed surface of the disc 0.25 inch wide, adhesive, annular spacers are applied to the inner and outer edges of the disc. An identical, second, poly(methyl methacrylate) disc substrate is then applied in register to the annular adhesive spacers to form an air-gap between the embossed optical element and the sealed protective layer.

I claim:

1. A method for replicating an optical element having a surface relief hologram comprising the sequential steps of:
   (a) laminating a dry photohardenable film to a surface of a dimensionally stable optically transparent substrate, the film capable of being embossed at room temperature to form a relief holographic image having an aspect ratio of at least 10:1;
   (b) embossing a relief holographic image in the photohardenable film at room temperature by applying thereto under pressure a stamper containing a reverse relief image of the hologram having an aspect ratio of at least 10:1;
   (c) passing actinic radiation through the transparent substrate and the unheated photohardenable film to effect hardening of the photohardenable film while maintaining embedded contact between the stamper and the photohardenable film; and
   (d) separating the stamper from the photohardened film containing the surface relief hologram having an aspect ratio of at least 10:1.

2. The method of claim 1 in which a polymeric protective layer is applied to the surface of the embossed photohardened film subsequent to the embossing step.

3. The method of claim 1 in which the substrate is formed into a disc prior to lamination.

4. The method of claim 1 in which the substrate is in sheet form prior to lamination and is formed into a disc following lamination.

5. The method of claim 1 in which the substrate is made from a material selected from the group consisting of polycarbonate, poly(methylmethacrylate) or glass.

6. The method of claim 1 in which the photohardenable film has a creep viscosity of at least 20 megapoise.

7. The method of claim 1 in which the stamper is made by the sequential steps of:
   (e) applying a second dry photohardenable film to a surface of a dimensionally stable substrate;
   (f) embossing the exposed surface of the second photohardenable film with the surface of a relief hologram;
   (g) passing actinic radiation through the second photohardenable film to effect hardening of the second photohardenable film while it is in contact with the stamper; and
   (h) separating the photohardened film from the relief hologram.

8. The method of claim 7 in which a release layer is applied to the second photohardened film after step (h).

9. The method of claim 8 in which the release layer is either Al or Cr.

10. The method of claim 8 in which the release layer is a low surface energy solid organic polymer.

11. The method of claim 10 in which the low surface energy solid organic polymer is a fluoropolymer.

12. A method for replicating an optical element having a surface relief hologram, comprising:
  (a) embossing a relief holographic image having an aspect ratio of at least 10:1 in a dry photohardenable film at room temperature by applying thereto under pressure a stamper containing a reverse relief image of the relief image having an aspect ratio of at least 10:1, wherein the dry photohardenable film is supported by a dimensionally stable, optically transparent substrate;
  (b) passing actinic radiation through the transparent substrate and the embossed dry photohardenable film while maintaining embedded contacted between the stamper and the photohardenable film; and
  (c) separating the stamper from the film containing the surface relief hologram having the aspect ratio of at least 10:1,
  wherein the dry photohardenable film consists essentially of an admixture of 5–50% liquid ethylenically unsaturated monomer or monomers, 0.1–10% initiator system, 25–75% solid polymeric binder or binders, 0–25% plasticizer or plasticizers, and 0–5% other ingredients, wherein the percentages are percents by weight.

13. The method of claim 12, wherein at least one of the monomers contains more than one ethylenically unsaturated group.

14. The method of claim 12, wherein at least one of the monomers contains three ethylenically unsaturated groups.

15. The method of claim 12, wherein at least one of the monomers is a triacrylate or a trimethacrylate of trimethylolpropane or ethoxylated trimethylolpropane.

16. The method of claim 12, wherein the admixture includes:
  at least one monomer from the group consisting of trimethylolpropane trimethacrylate and triacrylate ester of ethoxylated trimethylolpropane; and
  at least one binder form the group consisting of poly(methyl methacrylate) and poly(vinyl acetate).

17. The method of claim 12, wherein the dry photohardenable film comprises an admixture of:
  poly(methyl methacrylate);
  poly(vinyl acetate);
  trimethylolpropane trimethacrylate;
  triacrylate ester of ethoxylated trimethylolpropane;
  1,1'-biimidazole, 2,2'-bis[o-chloro-phenyl]-4,4',5,5'-tetraphenyl-;
  2-mercapto benzoxazole;
  2-(stibyl-4")-(naphto-1',2',4,5)-1,2,3-triazol-2"-sulfonic acid phenyl ester;
  3-phenyl-7-[2'-(4'-N,N-diethylamino-6'-chloro-1',3',5'-triazinylamino]-coumarin;
  (2-hydroxy-4-methoxyphenyl) (2-hydroxyphenyl) methanone;
  polyoxyethylene (4) lauryl ether;
  hydroquinone; and
  1,4,4-trimethyl-2,3-diazobicyclo-(3.2.2-)-non-2-ene-2,3-dioxide.

* * * * *